United States Patent
Koelmel et al.

(10) Patent No.: US 8,309,475 B2
(45) Date of Patent: *Nov. 13, 2012

(54) APPARATUS AND METHOD OF ALIGNING AND POSITIONING A COLD SUBSTRATE ON A HOT SURFACE

(75) Inventors: Blake Koelmel, Mountain View, CA (US); Abhilash J. Mayur, Salinas, CA (US); Kai Ma, Palo Alto, CA (US); Alexander N. Lerner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/343,523

(22) Filed: Jan. 4, 2012

(65) Prior Publication Data
US 2012/0122253 A1 May 17, 2012

Related U.S. Application Data

(60) Continuation of application No. 12/839,282, filed on Jul. 19, 2010, now Pat. No. 8,097,543, which is a division of application No. 12/013,355, filed on Jan. 11, 2008, now abandoned.

(51) Int. Cl.
*H01L 21/26* (2006.01)
(52) U.S. Cl. .................... 438/795; 257/E21.328
(58) Field of Classification Search .................. 438/795; 257/E21.328, E21.521
See application file for complete search history.

(56) References Cited

U.S. PATENT DOCUMENTS

| 4,681,776 A | 7/1987 | Bok |
| 5,761,023 A | 6/1998 | Lue et al. |
| 6,113,702 A | 9/2000 | Halpin et al. |
| 6,343,183 B1 | 1/2002 | Halpin et al. |
| 6,454,866 B1 | 9/2002 | Halpin et al. |
| 6,491,757 B2 | 12/2002 | Halpin et al. |
| 6,692,576 B2 | 2/2004 | Halpin et al. |

(Continued)

FOREIGN PATENT DOCUMENTS
JP 10022368 A 1/1998
(Continued)

OTHER PUBLICATIONS

ASM International N.V.: Products—"Levitor", http://www.asm.com/index.php?option=com_content&task=view&id=13&Itemid=52 <http://asm.com/index.php?option=com_content&task=view&id=13&Itemid=52>.

(Continued)

*Primary Examiner* — Thao Le
(74) *Attorney, Agent, or Firm* — Patterson & Sheridan, LLP

(57) ABSTRACT

Embodiments of the invention contemplate a method, apparatus and system that are used to support and position a substrate on a surface that is at a different temperature than the initial, or incoming, substrate temperature. Embodiments of the invention may also include a method of controlling the transfer of heat between a substrate and substrate support positioned in a processing chamber. The apparatus and methods described herein generally may also provide an inexpensive and simple way of accurately positioning a substrate on a substrate support that is positioned in a semiconductor processing chamber. Substrate processing chambers that can benefit from the various embodiments described herein include, but are not limited to RTP, CVD, PVD, ALD, plasma etching, and/or laser annealing chambers.

19 Claims, 5 Drawing Sheets

U.S. PATENT DOCUMENTS

| | | | |
|---|---|---|---|
| 6,839,507 B2 | 1/2005 | Adams et al. | |
| 2005/0126605 A1 | 6/2005 | Yassour et al. | |
| 2006/0102076 A1* | 5/2006 | Smith et al. | 118/715 |
| 2006/0196852 A1 | 9/2006 | Bann et al. | |
| 2007/0128864 A1* | 6/2007 | Ma et al. | 438/680 |
| 2007/0197138 A1 | 8/2007 | Montierth et al. | |
| 2007/0246500 A1 | 10/2007 | Slikkerveer | |
| 2007/0283709 A1* | 12/2007 | Luse et al. | 62/259.2 |
| 2009/0181553 A1 | 7/2009 | Koelmel et al. | |
| 2010/0279516 A1 | 11/2010 | Chen et al. | |

FOREIGN PATENT DOCUMENTS

| | | |
|---|---|---|
| JP | 2003511847 | 3/2003 |
| JP | 2003515947 | 5/2003 |
| JP | 2005244191 A | 9/2005 |
| KR | 1020050008688 | 10/2004 |

OTHER PUBLICATIONS

CoreFlow: "Coating", <http://aop.co.il/customers/core/page.asp?cat=65&lang=1&type=2>.

CoreFlow: "From Technology to Solution", <http://www.coreflow.com/page.asp?cat=79&type=2&lang=1>.

CoreFlow: "Handling", <http://aop.co.il/customers/core/page.asp?cat=66&lang=1&type=2>.

CoreFlow: "Smart Nozzles", <http://www.coreflow.com/page.asp?cat=113&type=2&lang=1>.

CoreFlow: "Thermal Platforms", <http://www.coreflow.com/page.asp?cat=140&type=2&lang=1>.

CoreFlow: "Thermal Processes", <http://www.coreflow.com/page.asp?cat=71&type=2&lang=1>.

CoreFlow: "XY(Z) Accurate Platforms", <http://aop.co.il/customers/core/page.asp?cat=138&type=2&lang=1>.

PCT International Search Report and Written Opinion dated Aug. 17, 2009 for International Application No. PCT/US2009/030275.

Tru-Si Technologies. "No Touch Handling", <http://trusi.com/notouchhandling.html>.

\* cited by examiner

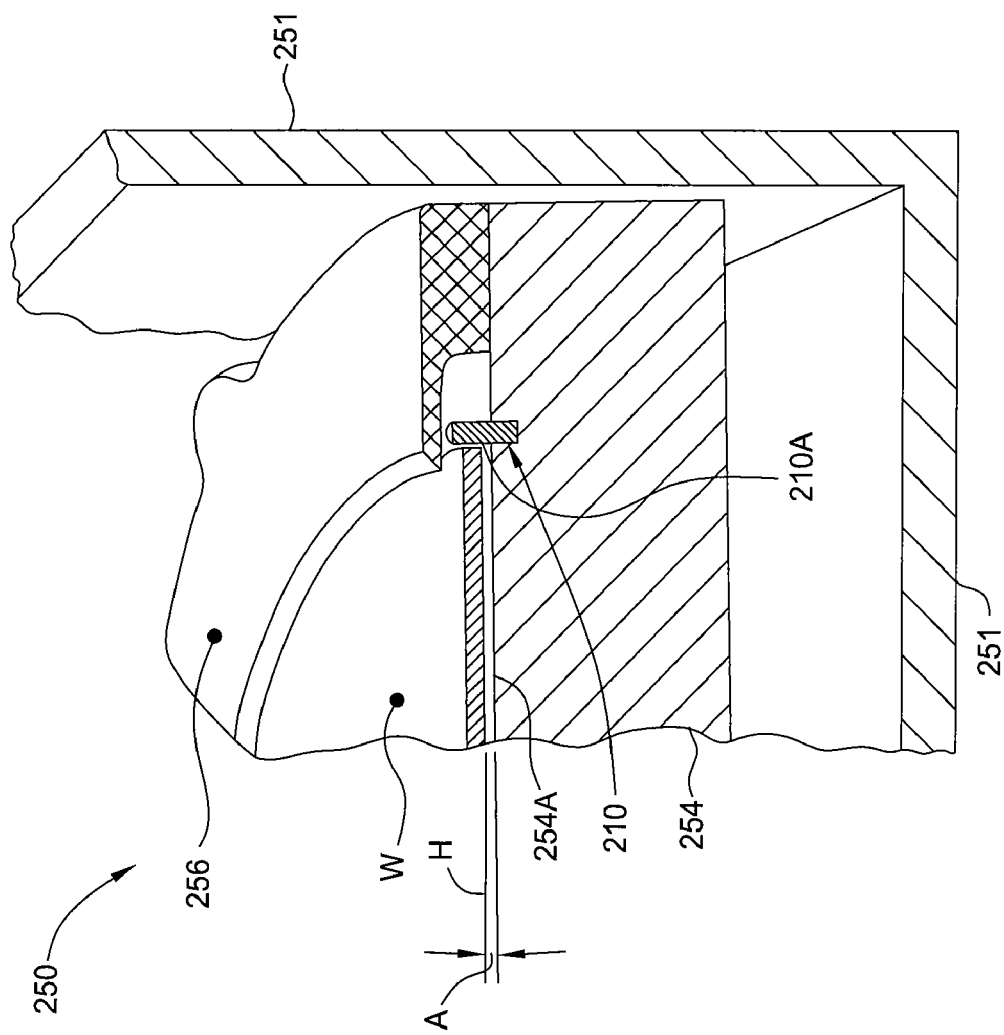

APPARATUS AND METHOD OF ALIGNING AND POSITIONING A COLD SUBSTRATE ON A HOT SURFACE

CROSS-REFERENCE TO RELATED APPLICATIONS

This application is a continuation of U.S. patent application Ser. No. 12/839,282, filed Jul. 19, 2010 now U.S. Pat. No. 8,097,543, which is a divisional of U.S. patent application Ser. No. 12/013,355, filed Jan. 11, 2008 now abandoned, which are herein incorporated by reference.

BACKGROUND OF THE INVENTION

1. Field of the Invention

Embodiments of the present invention generally relate to an apparatus and method that is used to manufacture a semiconductor device. More particularly, the invention is directed to an apparatus and method that is used to thermally process a substrate.

2. Background of the Related Art

The integrated circuit (IC) market is continually demanding greater memory capacity, faster switching speeds, and smaller feature sizes. One of the major steps the industry has taken to address these demands is to change from batch processing silicon wafers in large furnaces to single wafer processing in a small chamber.

During such single wafer processing the wafer is typically heated to high temperatures so that various chemical and physical reactions can take place in multiple IC devices defined in the wafer. Of particular interest, favorable electrical performance of the IC devices requires implanted regions to be annealed. Annealing recreates a more crystalline structure from regions of the wafer that were previously made amorphous, and activates dopants by incorporating their atoms into the crystalline lattice of the substrate, or wafer. Thermal processes, such as annealing, require providing a relatively large amount of thermal energy to the wafer in a short amount of time, and thereafter rapidly cooling the wafer to terminate the thermal process. Examples of thermal processes currently in use include Rapid Thermal Processing (RTP) and impulse (spike) annealing. While such processes are widely used, current technology is not ideal. It tends to ramp the temperature of the wafer too slowly and expose the wafer to elevated temperatures for too long. These problems become more severe with increasing wafer sizes, increasing switching speeds, and/or decreasing feature sizes.

In general, these thermal processes heat the substrates under controlled conditions according to a predetermined thermal recipe. These thermal recipes fundamentally consist of a temperature that the semiconductor substrate must be heated to, the rate of change of temperature, i.e., the temperature ramp-up and ramp-down rates and the time that the thermal processing system remains at a particular temperature. For example, thermal recipes may require the substrate to be heated from room temperature to distinct temperatures of 1200° C. or more, for processing times at each distinct temperature ranging up to 60 seconds, or more. Moreover, to meet certain objectives, such as minimal inter-diffusion of materials between different regions of a semiconductor substrate, the amount of time that each semiconductor substrate is subjected to high temperatures must be restricted. To accomplish this, the temperature ramp rates, both up and down, are preferably high. In other words, it is desirable to be able to adjust the temperature of the substrate from a low to a high temperature, or visa versa, in as short a time as possible.

The requirement for high temperature ramp rates led to the development of Rapid Thermal Processing (RTP), where typical temperature ramp-up rates range from 200 to 400° C./s, as compared to 5-15° C./minute for conventional furnaces. Typical ramp-down rates are in the range of 80-150° C./s. A drawback of RTP is that it heats the entire wafer even though the IC devices reside only in the top few microns of the silicon wafer. This limits how fast one can heat up and cool down the wafer. Moreover, once the entire wafer is at an elevated temperature, heat can only dissipate into the surrounding space or structures. As a result, today's state of the art RTP systems struggle to achieve a 400° C./s ramp-up rate and a 150° C./s ramp-down rate.

To resolve some of the problems raised in conventional RTP type processes various scanning laser anneal techniques have been used to anneal the surface(s) of the substrate. In general, these techniques deliver a constant energy flux to a small region on the surface of the substrate while the substrate is translated, or scanned, relative to the energy delivered to the small region. The scanned laser anneal, RTP and other thermal processes, which may include pulsed laser anneal techniques, are commonly performed to thermal process the devices formed on the surface of the substrate.

To help reduce the processing time and improve the performance of a thermal process performed in a thermal processing chamber it is common to preheat the substrate to a moderate temperature to improve throughput, reduce the induced thermal stress, and improve the process results by reducing the temperature range that the substrate needs go through during the thermal process. Typically, the preheat temperature used in RTP and laser annealing processes range from about 450° C. to about 700° C. In most cases, the preheat processes are performed by positioning a substrate on a heated substrate support, which is heated by embedded resistive heating elements positioned in the substrate support, or is heated by lamps. One problem that arises in the heated substrate support configuration is that when not all regions of the substrate come into good thermal contact with the heated substrate support at the same time, the substrate will deform due to the varying thermal expansion of the substrate created by the varying temperatures within the substrate. It has been found that in cases where the center of a substrate comes in contact with the support first, the substrate will deform into a shape (e.g., concave shape) that can greatly affect process results achieved from the center to edge of the substrate. In view of the above, there is a need for an apparatus and method of receiving a cold wafer on a heated support so that the thermal variation across the substrate during the initial exposure to a heated substrate support will not affect the process results.

Another issue that arises is that as device sizes decrease the tolerance to temperature variation across the substrate has become very low, such that the alignment and positioning of a substrate relative to the substrate support can have an affect on the uniformity of the process results achieved on the substrate. Due to thermal uniformity and/or substrate breakage concerns it is common in some thermal processing configurations to use a shadow ring to shadow and/or retain a portion of the edge of the substrate. Typically, since most semiconductor manufacturers are concerned about the process results across the substrate surface except a 3 mm (~0.12 inches) region at the edge of the substrate, this is the only area over which the shadow ring can cover to reduce thermal effects created at the edge of the substrate. However, it is typical for most conventional automated systems for the robot to have a positioning error of about +/−0.010 inches. Thermal uniformity results are generally affected by substrate misplacements on the order of about 0.004 inches. To resolve these types of issues a highly accurate or precise robots are often required to precisely place a substrate within a desired position in the processing chamber. These types of solutions are often expensive and are not reliable due to variations in placement due to wear on the robot, or temperature variations in the robot assembly found after the transferring the first versus the 25$^{th}$ wafer in a process sequence. The complexity and cost of the system also generally increase as the need for high temperature robotic components (e.g., bearings), precise and expensive motors, complex control systems, and reliable rotating vacuum seals. Therefore, there is a need for a simple, inexpensive, and reliable method and apparatus for accurately positioning and aligning the substrate to the various chamber components.

SUMMARY OF THE INVENTION

The present invention generally provides a processing chamber for processing a substrate, comprising a substrate support having a substrate supporting surface that is disposed at an angle relative to the horizontal, a plurality of ports which are adapted to direct a fluid to a region formed between the substrate supporting surface and a substrate that is disposed over the substrate supporting surface, a heating element that is in thermal contact with the substrate supporting surface and is adapted to heat the substrate disposed on the substrate supporting surface, and two or more alignment features having a substrate contact surface, wherein the two or more alignment features are positioned to align the substrate relative to the substrate supporting surface when the substrate is disposed against the substrate contact surface of each of the two or more alignment features.

Embodiments of the invention further provide a method of processing a substrate, comprising heating a substrate support having a substrate supporting surface, delivering a flow of a fluid to a plurality of ports formed in the substrate support, wherein the flow of fluid creates a cushion of fluid that is adapted to support the weight of the substrate; positioning a substrate on the cushion of fluid for a desired period of time, wherein the substrate is not in physical contact with the substrate supporting surface, reducing the flow of fluid to allow the substrate to contact at least a portion of the substrate supporting surface, and performing a substrate processing step on the substrate disposed on the substrate supporting surface.

Embodiments of the invention further provide a method of processing a substrate, comprising heating substrate support having a substrate supporting surface, delivering a flow of a fluid to a plurality of ports formed in the substrate support, wherein the flow of fluid creates a cushion of fluid that is adapted to support the weight of the substrate, positioning a substrate on the cushion of fluid, aligning the substrate to the substrate support while the substrate is positioned on the cushion of fluid, reducing the flow of fluid to allow the substrate to contact at least a portion of the substrate supporting surface, and performing a substrate processing step on the substrate disposed on the substrate supporting surface.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

FIG. 2C is a close up isometric cross-sectional view of a portion of the thermal processing chamber shown in FIG. 2A according to one embodiment of the invention;

DETAILED DESCRIPTION

Embodiments of the invention contemplate a method, apparatus and system that are used to support and position a substrate on a surface that is at a different temperature than the initial, or incoming, substrate temperature. Embodiments of the invention may also include a method of controlling the transfer of heat between a substrate and substrate support positioned in a processing chamber. The apparatus and methods described herein generally may also provide an inexpensive and simple way of accurately positioning a substrate on a substrate support that is positioned in a semiconductor processing chamber.

Substrate processing chambers that can benefit from the various embodiments described herein include, but are not limited to a rapid thermal processing (RTP) chamber, a chemical vapor deposition (CVD) chamber, a physical vapor deposition (PVD) chamber, atomic layer deposition (ALD) chamber, dry etching chamber, and/or laser annealing chamber. Substrates that may be processed using the methods, apparatus and system described herein may include, but are not limited to 200 mm, 300 mm or larger single crystal silicon (Si), multi-crystalline silicon, polycrystalline silicon, germanium (Ge), silicon carbide (SiC), glass, gallium arsenide (GaAs), cadmium telluride (CdTe), cadmium sulfide (CdS), copper indium gallium selenide (CIGS), copper indium selenide (CuInSe$_2$), gallium indium phosphide (GaInP$_2$), as well as heterojunction cells, such as GaInP/GaAs/Ge or ZnSe/GaAs/Ge substrates. Preferably, the substrates are circular, but could be any other desirable shape. In one embodiment, the substrate is a semiconductor substrate that has a plurality of semiconductor devices formed on a processing surface, which is generally on the opposing side of the substrate from the lower surface $W_1$ (FIG. 1) of the substrate W.

Figure 1:
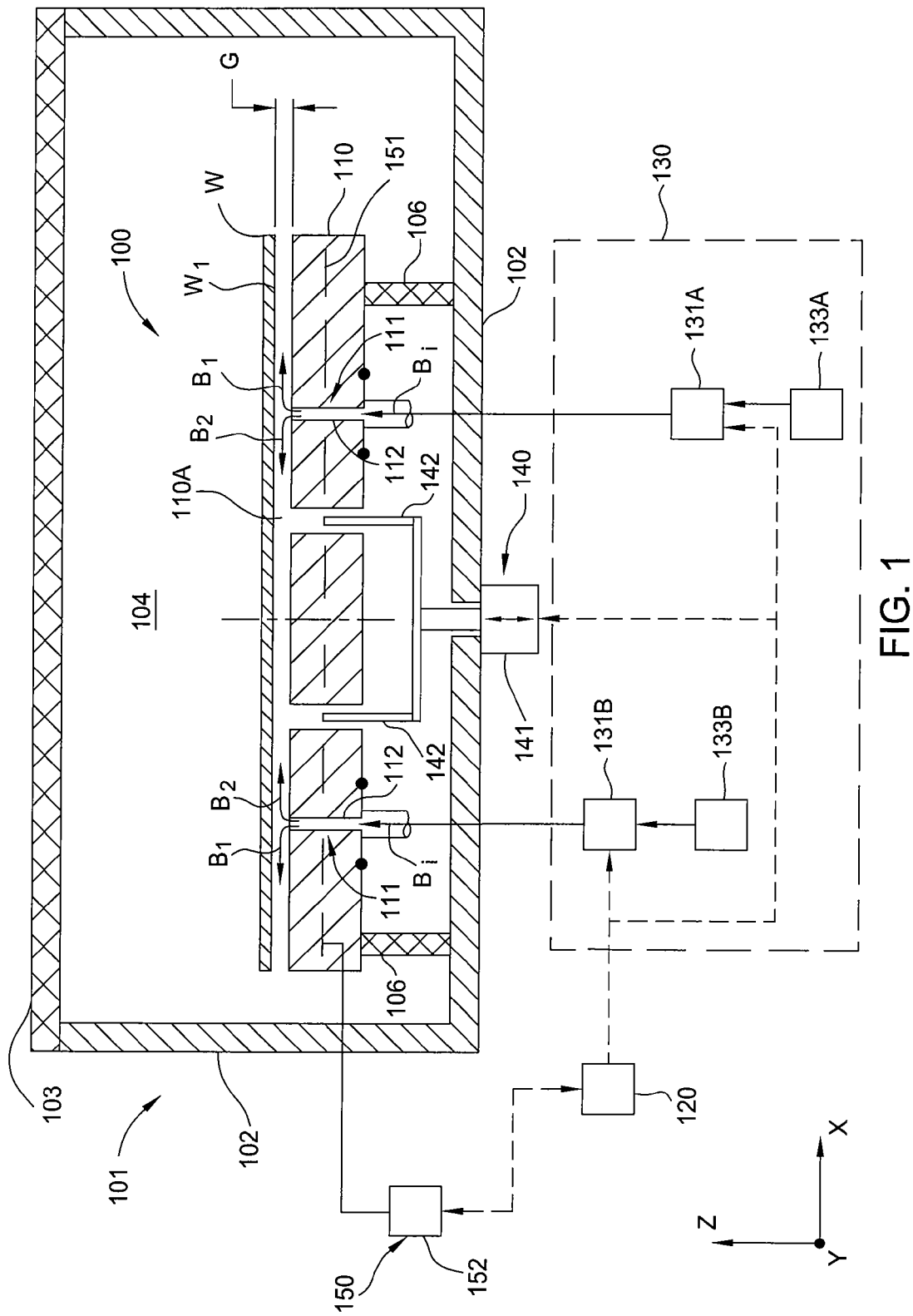
FIG. 1 is a cross-sectional view of a processing chamber and substrate support assembly according to one embodiment of the invention.

Embodiments of the invention can provide a substrate support that is able to support and position a substrate using a fluid that is delivered from a plurality of ports formed in a substrate support assembly 100 (FIG. 1). The delivery of the fluid to the substrate surface allows the substrate to be easily moved by gravity, or other applied forces, to a desired position on the substrate support. Also, as device sizes shrink the tolerance for particle contamination has dramatically decreased, thus it is generally desirable to prevent the lower surface $W_1$ of the substrate W from sliding against the substrate support, while it is being positioning on the substrate support. Typically, the fluid is a gas, such as nitrogen, helium, argon, krypton, neon, hydrogen, or combinations thereof, but in some applications could be a liquid.

FIG. 1 is a schematic cross-sectional view that illustrates a processing chamber 101 that contains one or more walls 102, a lid 103, a substrate lift assembly 140 and a substrate support assembly 100 that is disposed on a support 106 in the processing region 104 of the processing chamber 101. In general, the processing chamber 101 may be an RTP, CVD, PVD, ALD, dry etching, laser annealing chamber, or other similar type of substrate processing chamber. The substrate lift assembly 140 generally contains a plurality of lift pins 142 and an actuator 141 (e.g., air cylinder, DC servo motor and lead screw) that are adapted to transfer a substrate to and from the substrate support 110, which is contained in the substrate support assembly 100, and a substrate transferring device, such as a robot.

The substrate support assembly 100 generally contains a substrate support 110, a fluid delivery system 130, temperature control assembly 150, and a system controller 120. In one embodiment, as shown in FIG. 1, the substrate "W" is supported on the fluid "B" delivered from the fluid delivery system 130 to the ports 111 (only one shown) formed in the substrate support 110. In this view a substrate W is supported above the substrate support 110 by the fluid delivered through port 111 so that a gap "G" is formed between the substrate W and the substrate support 110. The gap "G" created by the fluid B may be between about 1 µm and about 1000 µm. Optionally, a sensor (not shown), such as an optical sensor, may be positioned and configured to detect the height so that the system controller 120 can adjust the fluid flow through the ports 111 so that a desired height is achieved.

In one embodiment, the temperature control assembly 150 generally contains a heating element 151 that is in thermal contact with the substrate support 110 and a temperature controller 152. The heating element 151 can be a resistive heating element that is embedded within the substrate support 110. In one embodiment, the heating element is adapted to heat a substrate W that is placed in thermal contact with the substrate support 110 to an elevated temperature, such as between about 450° C. and about 800° C. The temperature controller 152 generally contains a power source (not shown) and a temperature measurement device (not shown) that are adapted to control the temperature of the substrate support 110 using conventional means.

In one embodiment, the substrate support 110 can be formed from a metal, ceramic, plastic, semiconductor or other material used to support substrates during processing. In one embodiment, the substrate support 110 is made of a metal, such as aluminum, and stainless steel. In another embodiment, the substrate support 110 is made of a ceramic material, such as quartz, sapphire, silicon carbide, alumina, zirconia, aluminum nitride, or boron nitride.

The fluid delivery system 130 generally contains one or more fluid control components that are used to provide and control the delivery of fluid to the ports 111 formed in the substrate support 110. In one embodiment, the fluid delivery system 130 contains one or more fluid sources (e.g., fluid sources 133A-133B) that deliver fluid to each of the ports 111 using a fluid controlling device (e.g., fluid controlling devices 131A-131B). The fluid controlling devices are adapted to control the flow, velocity and/or pressure of the fluid delivered to the ports 111 by use of commands sent from the system controller 120. In one embodiment, the fluid controlling devices (e.g., reference numerals 131A-131B) are conventional mass flow controllers (MFCs) that are in communication with the system controller 120. In another embodiment, the fluid controlling devices are a fixed orifice that is configured to deliver desired flows at various known pressures. The control of the substrate movement can also be affected by the type of fluids (e.g., gases, liquids) delivered by the one or more ports, and thus the viscosity, atomic mass, pressure, and density need to be taken into account. The selection of the fluid generally must also take into account its affect on the process performed in the processing region 104.

The system controller 120 is adapted to control the various components used to complete the substrate support assembly 100 and processing chamber 101. The system controller 120 is generally designed to facilitate the control and automation of the overall process chamber and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, fluid sources, etc.) and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the system controller 120 determines which tasks are performable on a substrate. Preferably, the program is software readable by the system controller 120 that includes code to perform tasks relating to monitoring, execution and control of the movement, support, and/or positioning of a substrate, along with the various process recipe tasks and various chamber process recipe steps being performed in the processing chamber 101. In one embodiment, the system controller may use conventional PID control algorithms to control the delivery of fluid to the ports to actively control the support and position of the substrate.

Embodiments of the invention generally provide orienting the one or more ports 111 so that the fluid flowing from or within the ports 111 can support the substrate W so that it can be positioned as needed. In one embodiment, as shown in FIGS. 1 and 2 the port 111 contains an aperture 112 that is oriented in a substantially normal orientation to the lower surface $W_1$ of the substrate W. In this configuration the inlet flow $B_i$ passing through the aperture 112 strikes the lower surface $W_1$ of the substrate W causing the fluid to flow in various directions, such as directions $B_1$, $B_2$. When the flow and/or pressure of the inlet flow $B_i$ delivered from the fluid delivery system 130 through the aperture 112 is high enough a gap "G" is formed between the substrate W and the substrate support 110. The fluid delivered through the apertures 112 to form the gap "G", thus form a fluid cushion, on which the substrate is supported. Due to the perpendicular orientation of the aperture 112 to the lower surface $W_1$ of the substrate W the inlet flow $B_i$ will generally tend to support the substrate and move the substrate in only a vertical direction (i.e., Z-direction). It should be noted that the size of gap "G" formed by the flowing fluid will depend on pressure of the flowing fluid relative to the pressure in the processing region 104 (FIG. 1), the weight of the substrate W, the angle of the impinging fluid, the properties of the fluid, and the velocity of the flowing fluid from the apertures 112. It is believed that by adjusting the velocity, flow, and angle with which the fluid interacts with the substrate surface the momentum exchange and friction created between the fluid and the substrate can be used to dynamically position, move, and/or rotated the substrate relative to the substrate support 110. It has been found that flows in the subsonic regime (e.g., Mach number <1) greatly improve the coupling efficiency of the fluid to the substrate. Thus, it is generally desirable to design the apertures, and also deliver fluids to the nozzles at pressures that will cause the fluid to exit the apertures at a subsonic velocity.

As noted above, one problem that arises when using a heated substrate support to heat a substrate is that either due to bow of the substrate caused by residual internals stress in the substrate or thermal stress created by thermal variations in the substrate, not all regions of the substrate come into good thermal contact with the heated substrate support at the same time. The thermal contact variation thus can cause the substrate to further deform due to the varying thermal expansion of the substrate created by the varying temperatures across the substrate. Most substrate processing steps require a "soak period" during the preheat step, which is used to allow the temperatures across the substrate to equilibrate to a temperature that is within a desirable range, or that allow all regions of the substrate to reach a desired temperature before the substrate processing step(s) can start. In cases where the focal length of the energy delivered to the substrate surface is an issue, such as laser annealing processes, the distortion of the substrate can also greatly affect the process results. Therefore, in these types of processes long soak times are often required to assure that the substrate has a minimal distortion. In general, the distortion of the substrate due to varying thermal contact will greatly increase the "soak" time and the throughput of the substrate processing step(s). In one example, it has been found that bringing a substrate to a 450° C. substrate support requires at least 30 seconds of soak time to allow the substrate to reach a minimally distorted shape and have a desired thermal uniformity to allow a laser annealing process to be performed. In view of the above, there is a need for an apparatus and method of receiving a cold wafer on a heated support so that the thermal variation across the substrate during the initial exposure to a heated substrate support will not affect the process results and substrate throughput.

To resolve these issues, in one embodiment, it is desirable to position the substrate on a cushion of fluid that is formed over the substrate supporting surface for a desired period of time to allow the substrate temperature to uniformly heat up to a desired temperature before it is placed in contact with the heated substrate support or other supporting components. It is believed that the cushion of fluid will thermally isolate the heated substrate support from the cooler substrate, due to the need to conduct heat across the formed gap "G" (FIG. 1), which then allows the higher thermal conductivity of the substrate versus the thermal conductivity of the fluid in the formed fluid cushion to even out the temperature variation across the substrate as it is heated to a preheat temperature. Therefore, by minimizing the temperature variation the across the substrate, the distortion of the substrate will be minimized, which in most processing applications will reduce the time required to preheat the substrate, while also increasing the average temperature of the wafer. Due to particle concerns, substrate distortion concerns, and over all process result concerns it is desirable to assure that the lower surface $W_1$ of the substrate W is not in physical contact with the substrate support surface and/or other hot chamber components (e.g., shadow ring (discussed below)) during the preheat step.

In one embodiment, the preheat process generally occurs in three steps. In the first step, a substrate that is positioned on the lift pins 142 is then disposed on a fluid cushion created above the heated substrate support surface 110A by a fluid flowing through the plurality of ports 111 that are in fluid communication with the substrate support surface 110A. In one embodiment, a flow of gas at a flow rate between about 200 standard cubic centimeters/minute (sccm) and about 3000 sccms is used to support the substrate above the substrate support surface 110A. In one embodiment, a flow of nitrogen gas at a flow rate between about 200 sccm and about 600 sccm is used to support the substrate. In one embodiment, the fluid is a gas, such as nitrogen, helium, argon, krypton, neon, hydrogen, or combinations thereof.

In some cases, it is desirable to choose a gas that has a good thermal conductivity, such as helium (e.g., k=1.411 mW/cm-K at 273.2K), to increase the temperature ramp up rate of the substrate. However, using higher conductivity gases, such as helium, can tend to increase the temperature variation across the substrate, which will then lead to greater temperature non-uniformity, greater distortion of the substrate, and a longer than necessary preheat time. Surprisingly, it has been found that using lower thermal conductivity gases, such as nitrogen (e.g., k=0.237 mW/cm-K at 273.2K), can reduce the preheat time by providing a large enough thermal resistance to allow a substrate, such as a single crystal silicon wafer, to maintain a desirable thermal uniformity and distortion during the preheat portion of a high temperature thermal process. Typical, high temperature process may use a substrate support that is maintained at a temperature between about 450° C. and about 800° C.

Also, in one embodiment, the flow of fluid delivered through the ports 111 can be increased to a point where convective heat transfer has an affect on the heat transfer and uniformity of the substrate disposed on the cushion of fluid. It is believed that flows greater than about 3 slm at pressures near atmospheric pressure and temperatures between about 450-800° C. are at a point where convective heat transfer affects the heat transfer process between the substrate and the substrate support surface.

In the next step, the substrate is maintained on the fluid cushion for a desired period of time, or until a desired average temperature is achieved within the substrate. In one embodiment, the preheat time is between 5 seconds and about 30 seconds. In one example, a preheat time of about 10 seconds is required to heat a 300 mm silicon substrate to a temperature of about 640° C. with a substrate support temperature of about 720° C. using a flow rate of 200 scan of nitrogen that is supplied to the ports 111.

Finally, the fluid flow through the ports is reduced or shut-off so that the substrate can contact the substrate support surface 110A and the rest of the process can be performed on the substrate. In one embodiment, the substrate is then clamped, or "chucked", to the substrate surface 110A by use of a convention electrostatic chuck means, a vacuum chuck or a physical clamping mechanism to improve the thermal coupling between the substrate and the substrate support.

Thermal Processing Chamber

Figure 2A:
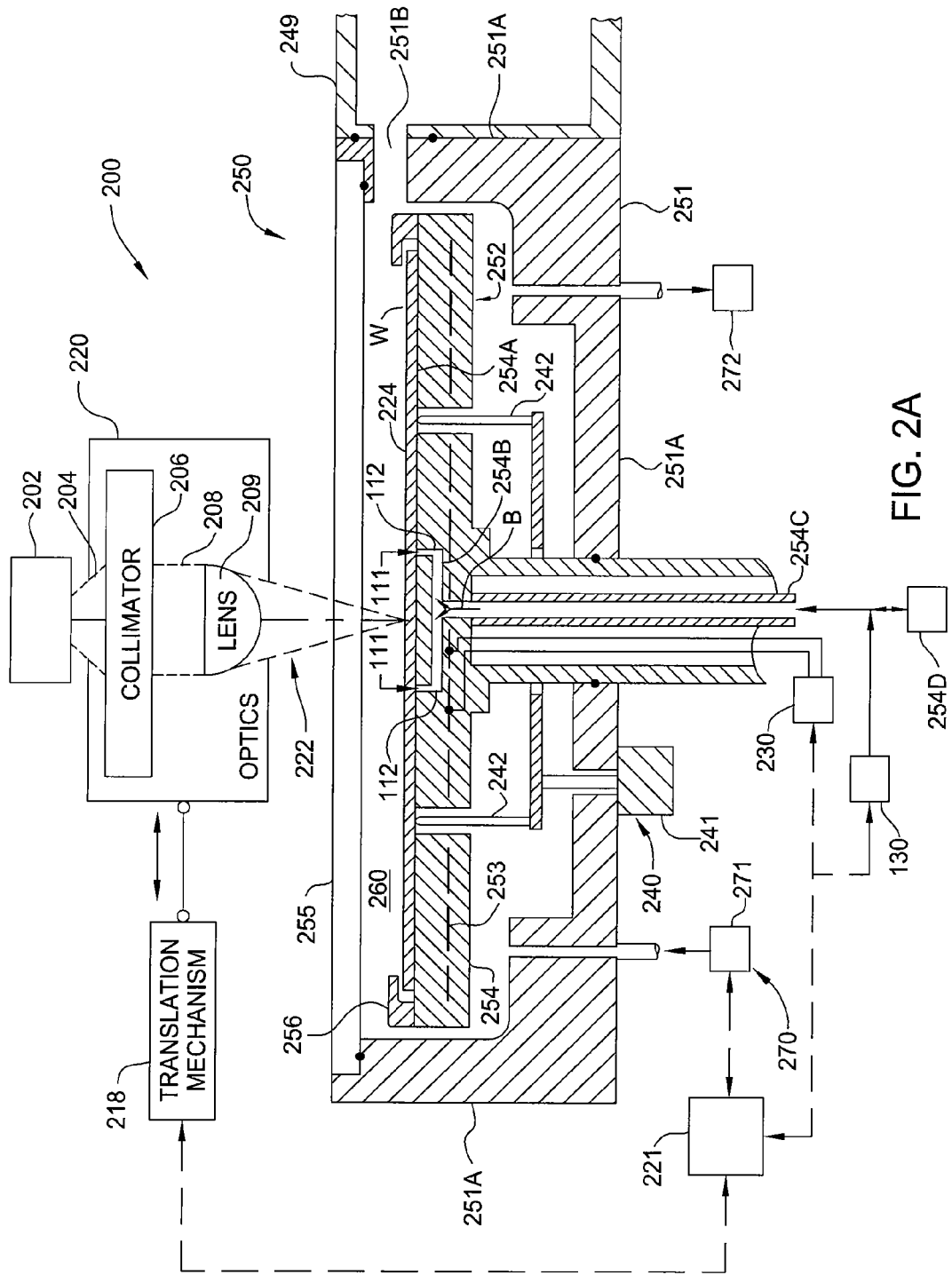
FIG. 2A is a cross-sectional view of a thermal processing chamber according to one embodiment of the invention.

FIG. 2A is a side cross-sectional view of an apparatus 200 for thermally processing a semiconductor substrate, according to an embodiment of the invention. For the practice of the invention, the preferred thermal process is annealing and annealing will be described throughout the remainder of the Figures. The apparatus 200 comprises an electromagnetic radiation source 202, a processing chamber 250, system controller 221, and optics 220 disposed between the electromagnetic radiation source 202 and the substrate support 252. In one embodiment, the substrate W is a substrate that has a high thermal conductivity, such as a single crystal silicon substrate, silicon on insulator (SOI), Silicon Germanium or alloys thereof, or the like.

In one embodiment, the electromagnetic radiation source 202 is capable of emitting continuous waves or rays of electromagnetic radiation, such as light. By continuous wave it is meant that the radiation source is capable of emitting radiation continuously, i.e., not a burst, pulse, or flash of light. Furthermore, as the continuous wave electromagnetic radiation needs to be adsorbed at or near the surface of the wafer, the continuous wave electromagnetic radiation preferably has a wavelength between 190 nm and 950 nm. More preferably, it has a wavelength of 808 nm.

In one embodiment, the electromagnetic radiation source 202 is capable of emitting radiation continuously for at least 15 seconds. The electromagnetic radiation source 202 may also comprise multiple laser diodes, each of which produces uniform and spatially coherent light at the same wavelength. In yet another preferred embodiment, the power of the laser diodes is in the range of 0.5 kW to 50 kW. Suitable laser diodes are made by Spectra-Physics of California, or by Cutting Edge Optronics, Inc. of St. Charles, Mo. An example of a method and apparatus of laser annealing a substrate is further described in the commonly assigned U.S. Pat. No. 7,005,601, filed Mar. 18, 2002, which is incorporated by reference herein.

In another embodiment, the electromagnetic radiation source 202 is adapted to deliver electromagnetic energy that is used to perform the pulse laser anneal process. Typical sources of electromagnetic energy include, but are not limited to an optical radiation source, an electron beam source, and/or a microwave energy source. In one embodiment, the electromagnetic radiation source 202 is adapted to deliver energy at a wavelength less than about 1064 nm to a primarily silicon containing substrate. In one aspect of the invention it is desirable to use an Nd:YAG (neodymium-doped yttrium aluminium garnet) laser that is adapted to deliver energy at a wavelength between about 266 nm and about 1064 nm. An example of a method and apparatus of a pulsed laser annealing a substrate is further described in the commonly assigned U.S. patent application Ser. No. 11/888,433, filed Jul. 31, 2007, which is incorporated by reference herein.

The optics 220 preferably comprise one or more collimators 206 to collimate radiation 204 from the electromagnetic radiation source 202 in a direction perpendicular to the upper surface 224 of the substrate W. This collimated radiation 208 is then focused by at least one lens 209 into a line of radiation 222 at an upper surface 224 of the substrate W. Lens 209 is any suitable lens, or series of lenses, capable of focusing radiation into a desired shape, such as a line. The lens 209 may be a cylindrical lens, one or more concave lenses, convex lenses, plane mirrors, concave mirrors, convex mirrors, refractive lenses, diffractive lenses, Fresnel lenses, gradient index lenses, or the like.

The apparatus 200 also comprises a translation mechanism 218 configured to translate the line of radiation 222 and the substrate support 252 relative to one another. In one embodiment, the translation mechanism 218 is coupled to the electromagnetic radiation source 202 and/or the optics 220 to move the electromagnetic radiation source 202 and/or the optics 220 relative to the substrate support 252. In another embodiment, the translation mechanism 218 is coupled to the substrate support 252 to move the substrate support 252 relative to the electromagnetic radiation source 202 and/or the optics 220. In yet another embodiment, the translation mechanism 218 moves both the electromagnetic radiation source 202 and/or the optics 220, and the substrate support 252. Any suitable translation mechanism may be used, such as a conveyor system, rack and pinion system, mechanical actuator, or the like.

The translation mechanism 218 is preferably coupled to a system controller 221 to control the scan speed at which the substrate support 252 and the line of radiation 222 move relative to one another. The system controller 221 is generally similar to the system controller 120 discussed above. In addition, the translation of the substrate support 252 and the line of radiation 222 relative to one another is preferably along a path perpendicular to the line of radiation 222 and parallel to the upper surface 224 of the substrate W. In a preferred embodiment, the translation mechanism 218 moves at a constant speed. Preferably, this constant speed is approximately 2 cm/s for a 35 micron wide line. In another embodiment, the translation of the substrate support 252 and the line of radiation 222 relative to one another is not along a path perpendicular to the line of radiation 222.

The processing chamber 250 generally contains a substrate support 252 configured to receive a substrate W thereon, a lift assembly 240, a transparent window 255, gas delivery system 270, and a chamber 251. The transparent window 255 is typically made of quartz, sapphire or other optically transparent material that allows the energy delivered from the electromagnetic radiation source 202 to pass there through and heat the upper surface 224 of the substrate W without significant energy loss.

The gas delivery system 270 generally contains a gas source 271 and an exhaust system 272 that are in fluid communication with the processing region 260 that is enclosed by the walls 251A of the chamber 251 and the transparent window 255. The gas source 271 is generally adapted to provide a flow of a gas, such as an inert gas (e.g., argon, nitrogen) into the processing region 260 to prevent the oxidation of the substrate surface when it is heated by the energy delivered from the electromagnetic radiation source 202 or heated by the heating elements 253. The exhaust system 272 is generally adapted to remove the injected gas delivered from the gas source, remove any volatile contaminants generated during thermal processing, and/or evacuate the processing region 260 to a pressure below atmospheric pressure by use of conventional mechanical rough pump, roots blower, or other similar fluid removal device. In one embodiment, the exhaust system 272 is adapted to evacuate the processing region 260 to a pressure less than about 300 Torr.

The chamber 251 is generally constructed of materials that can maintain a chamber pressure below atmospheric pressure, such as about 300 Torr, and a substrate deposition temperature between about 450° C. and about 800° C. In one embodiment, the chamber 251 can be made from a metal, such as aluminum or stainless steel that is water cooled. In one embodiment, the chamber 251 is coupled to transfer chamber 249 of a conventional cluster tool that contains a robot (not shown) that is adapted to transfer a substrate to and from the processing region 260 of the processing chamber 250 through an access port 251B. In one configuration, the transfer chamber 249 can be isolated from the processing region 260 of the processing chamber 250 by use of a conventional slit valve (not shown), or gate valve, to prevent contaminants from passing in either direction through the access port 251B.

The lift assembly 240 generally contains a plurality of lift pins 242 and an actuator 241 (e.g., air cylinder, DC servo motor and lead screw) that are adapted to move relative to the substrate support 252 so that a substrate W can be transferred to and from the substrate support 252, and to and from a substrate transferring device, such as a robot. As shown in FIG. 2A, the lift pins 242 are in the "down" position so that the substrate W can be positioned on the substrate supporting surface 254A of the substrate support 252.

The substrate support 252 is generally a platform capable of supporting the substrate W, as explained below. In one embodiment, the substrate support 252 includes a means for grasping the substrate, such as a frictional, gravitational, mechanical, or electrical system. Examples of suitable means for grasping include: mechanical clamps, electrostatic chuck, vacuum chuck, or the like. In one embodiment, the substrate support 252 contains a heating element 253 that is in electrical communication with temperature control assembly 230 and is in thermal contact with a substrate W when it is disposed on the substrate support 252. The heating element 253 can be a resistive heating element that is embedded within the support 254 of the substrate support 252. In one embodiment, the temperature control assembly 230 is adapted to supply power to the heating element 253 so that the substrate W can be heated to an elevated temperature, such as between about 450° C. and about 800° C. The temperature control assembly 230 generally contains a power source (not shown) and a temperature measurement device (not shown) that are adapted to control and monitor the temperature of the substrate support 252 using conventional means.

The substrate support 252 generally contains a support 254, a fluid delivery system 130 (discussed above), and a temperature control assembly 230 that are in communication with the system controller 221. In one embodiment, the substrate "W" can be supported on the fluid "B" delivered from the fluid delivery system 130 to the ports 111 formed in the substrate supporting surface 254A of the support 254. During one or more steps during thermal processing a substrate W can be supported on a cushion of gas above the substrate supporting surface 254A due to the fluid delivered through plenum 254B to the ports 111, so that a gap (FIG. 1) can be formed. The gap created by the fluid B may be between about 1 μm and about 1000 μm. In one embodiment, the support 254 can be formed from a metal, ceramic, plastic, semiconductor or other material used to support substrates during processing. In one embodiment, the support 254 is made of a ceramic material, such as quartz, sapphire, silicon carbide, alumina, zirconia, aluminum nitride, or boron nitride.

The fluid delivery system 130, which discussed above, generally contains one or more fluid control components that are used to provide and control the delivery of fluid to the ports 111 formed in the support 254. The fluid controlling devices are adapted to control the flow, velocity and/or pressure of the fluid delivered to the ports 111 by use of commands sent from the system controller 221. The fluid controlling devices can be conventional mass flow controllers (MFCs) that are in communication with the system controller 221, or a fixed orifice that is configured to deliver desired flow at a known pressure. The control of the substrate movement can also be affected by the type of fluids (e.g., gases) delivered by the one or more ports, and thus the viscosity, atomic mass, pressure, and density need to be taken into account. The selection of the fluid generally must also take into account its affect on the process performed in the processing region 260.

In one embodiment, of the processing chamber 250 a shadow ring 256 is disposed over a portion of the substrate support 252 and a substrate W when it is positioned on the substrate supporting surface 254A, as shown in FIG. 2A. The shadow ring 256 is generally designed to shadow the edge of the substrate to reduce any thermal uniformity edge effects and prevent substrate breakage as the line of radiation 222 is swept across the surface of the substrate W. The shadow ring 256 may be positioned relative to the substrate W and/or substrate supporting surface 254A by use of a shadow ring lift assembly (not shown) to allow the substrate to be transferred between the substrate supporting surface 254A and a robot (not shown) without interfering with the shadow ring 256. The shadow ring may be made of material that has a desired thermal mass, a desirable emissivity and absorption coefficient, and is able to withstand the energy delivered by the electromagnetic radiation source 202.

Figure 2B:
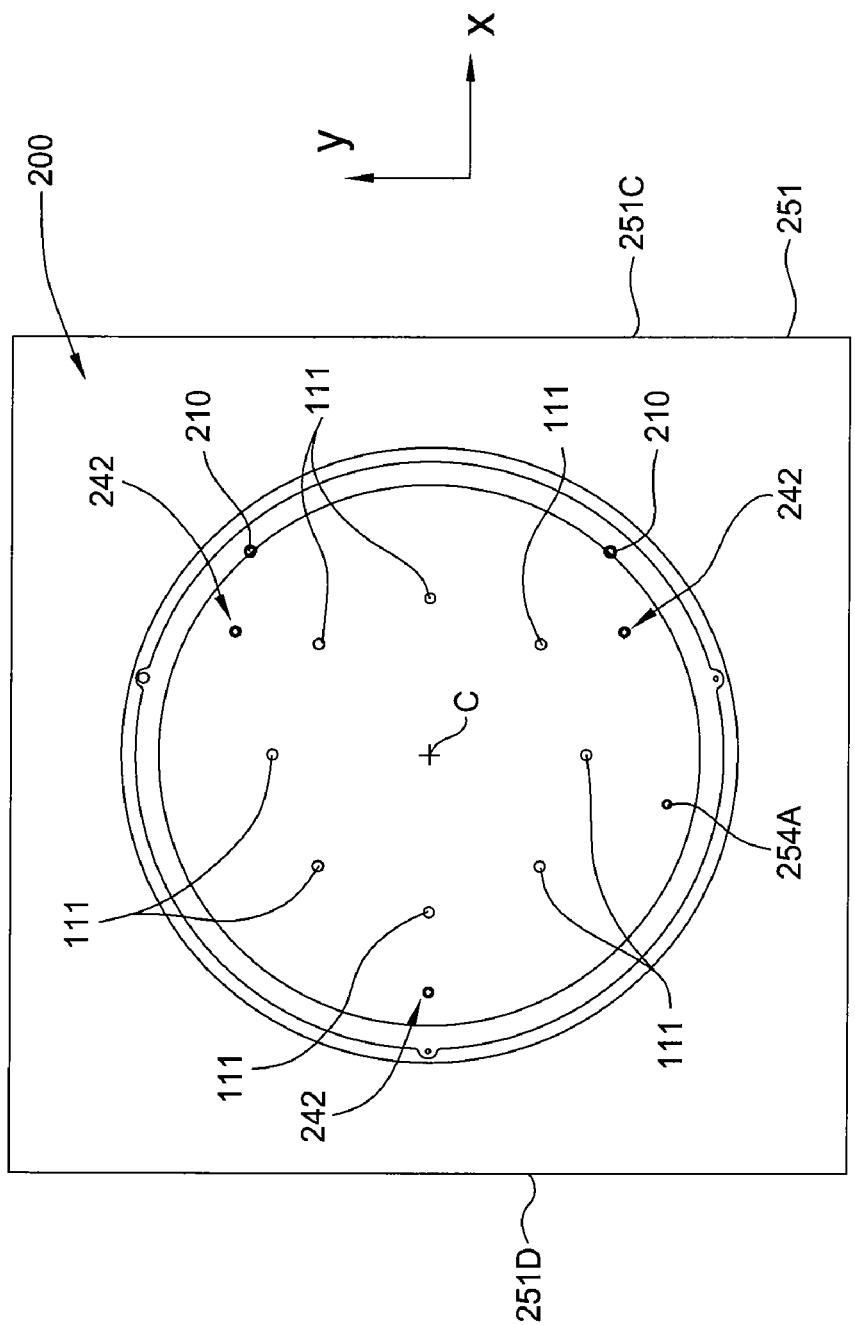
FIG. 2B is a plan view of the thermal processing chamber shown in FIG. 2A according to one embodiment of the invention.

FIG. 2B is a plan view of the apparatus 200 shown in FIG. 2A looking through the transparent window 255. In this view a plurality of ports 111 are disposed across the surface of the substrate supporting surface 254A to actively support a substrate (not shown for clarity) thereon during one or more steps during processing. In one embodiment, the support 254 contains between about 3 and about 8 ports that are evenly spaced around the center "C" of the substrate supporting surface 254A. Also, as shown, the apparatus 200 may contain three lift pins 242 that are evenly spaced around the center "C" of the substrate supporting surface 254A.

As noted above, one issue that arises in typical high temperature thermal processes is that as device sizes decrease the tolerance to temperature variation across the substrate has become very low (e.g., ≦2° C. at 1390° C.) such that the alignment and positioning of a substrate relative to the substrate support can have an affect on the uniformity of the process results achieved on the substrate. Embodiments of the invention may also provide an apparatus and method of accurately positioning and aligning a substrate to one or more features coupled to or formed on the substrate support 252. As noted above, since the placement accuracy of the robot may vary during the life of the various robotic components and may vary due to its varying exposure to the high temperature processing environment a method of reliably placing a substrate is needed.

To resolve this problem, in one embodiment, as shown in FIGS. 2B and 2C the substrate support 252 contains a plurality of alignment features 210 that are used to accurately align and position a substrate W to the substrate supporting surface 254A, support 254, and/or shadow ring 256. FIG. 2C is a close-up isometric cross-sectional view of the substrate support 252 and processing chamber 250. In one configuration, two or more alignment features 210 (FIG. 2B) are used to align and position a substrate W to the substrate supporting surface 254A, support 254, and/or shadow ring 256. In one embodiment, the alignment features 210 are connected to the support 254 (FIG. 2C) so that a substrate W that when a substrate is placed in contact with a surface 210A it is accurately aligned with center of the substrate supporting surface 254A, support 254, and/or shadow ring 256. In one embodiment, the alignment features 210 are attached, bonded or pressed into to the surface of the support 254. In one embodiment the shadow ring is also accurately aligned to the support 254 by use of an alignment feature(s) (not shown) that are used to align the shadow ring 256 to the support 254.

Figure 3:
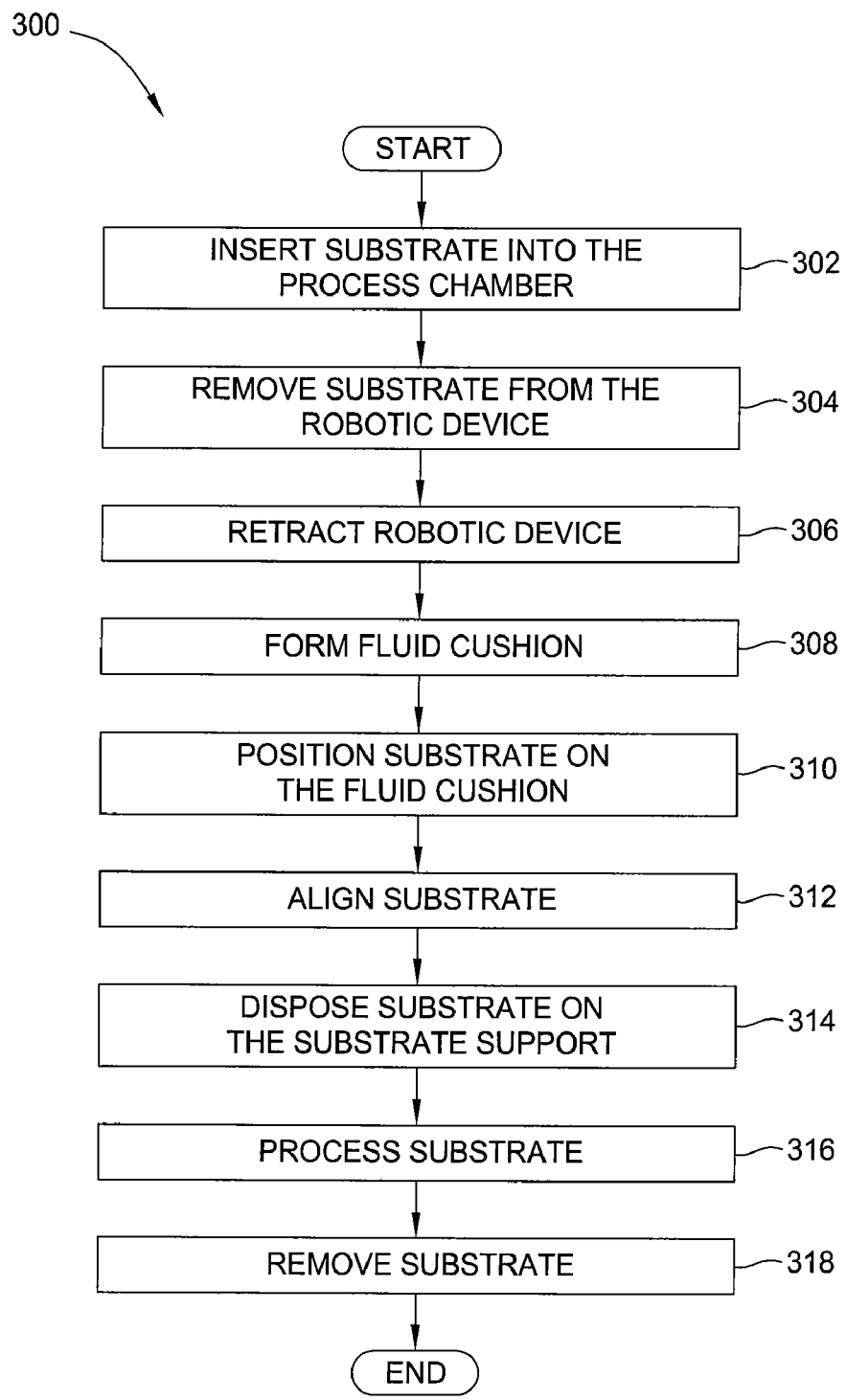
FIG. 3 illustrates a processing sequence according to one embodiment of the invention.

FIG. 3 illustrate one embodiment of a series of method steps 300 that are used to align the substrate to the alignment features 210. To facilitate the discussion of the method steps 300 the various hardware components illustrated in FIGS. 1 and 2A-2C will be referenced. The method steps 300 start with step 302 in which a substrate is inserted into the processing region 260 (FIG. 2A) through the access port 251B using a robot (not shown) that is positioned in the transfer chamber 249. In one embodiment, the substrate may be positioned in the processing region 260 using a conventional robot blade (not shown) that is attached to conventional robotic device (e.g., SCARA robot).

In the next step, step 304, the substrate is removed from the substrate transferring device (e.g., robot blade) that positioned the substrate within the processing region 260. In one embodiment, the lift pins 242 are moved by the actuator 241 upwards to a position where the substrate is separated from a substrate transferring device.

In the next step, step 306, the substrate positioning device (e.g., robot blade) is removed from the processing chamber 250. In one embodiment, the processing region 260 is then isolated from the transfer chamber 249 by use of a slit valve (not shown).

In the next step, step 308, a flow of fluid is provided to the ports 111 formed in the substrate supporting surface 254A by use of the fluid delivery system 130. The flow of fluid delivered to the ports 111 form a fluid cushion that can be used to support the weight of the substrate that is disposed thereon. As device semiconductor device sizes shrink the tolerance for particle contamination has dramatically decreased, thus it is generally desirable to prevent the lower surface $W_1$ (FIG. 1) of the substrate W from contacting the chamber components, such as the substrate supporting surface 254A while the substrate is being moved or aligned (e.g., step 312 below). In one embodiment, the fluid is a gas, such as nitrogen, helium, argon, xenon, krypton or other typical gas. In one embodiment, the fluid is nitrogen ($N_2$) gas.

In the next step, step 310, the substrate is positioned on the fluid cushion formed by the flowing fluid provided by the ports 111. In one embodiment, the substrate is disposed on the fluid cushion by lowering the lift pins 242 so that the substrate is positioned on and supported by the fluid cushion. The flow of the fluid required to support a substrate may depend on the weight of the substrate, the velocity of the fluid delivered by the ports, the orientation and spacing of the ports on the support surface, and the type of fluid delivered through the ports. In one embodiment, a flow of gas at a flow rate between about 2 standard liters/minute (slm) and about 30 slm is used to support the substrate. In one embodiment, a flow of nitrogen gas at a flow rate between about 2 slm and about 6 slm is used to support the substrate.

In the next step, step 312, the substrate is aligned relative to the substrate supporting surface 254A, support 254, and/or shadow ring 256 by use of a device or other mechanical means. In one embodiment, one or more conventional mechanically actuated centering elements can be used to align the substrate to the substrate supporting surface 254A, support 254, and/or shadow ring 256.

In another embodiment, the fluid cushion provides a near frictionless support of substrate that allows gravitationally induced forces to position the substrate. Referring to FIGS. 2B and 2C, in one embodiment, the substrate supporting surface 254A is positioned at an angle "A" (FIG. 2C) relative to the horizontal so that gravity can provide a force that tends to cause the substrate W disposed on the fluid cushion to move to a position where it comes in contact with the surface 210A (e.g., outer surface) of at least two of the two or more alignment features 210. In one configuration, the substrate supporting surface 254A is formed so that a permanent angle "A" is created between the substrate supporting surface 254A and the horizontal plane by the way the support 254 is connected to the chamber 251. In one embodiment, as shown in FIG. 2B, two alignment features 210 are disposed on the support 254 so that when a slight tilt of the substrate supporting surface 254A is created by tilting the processing chamber 250, the substrate moves to a position where it contacts the two alignment features 210. For example, in one configuration, if the two alignment features are two pins that are positioned so that a line created between the pins is parallel to the edge 251C of the processing chamber 250 (e.g., parallel to the Y-direction), when the center of the substrate W is placed to the left of the center "C" of the substrate supporting surface 254A by the robot (not shown) and the processing chamber 250 is tilted so that the edge 251D of the process chamber is higher than the edge 251C, gravity will cause the substrate to move towards and align itself with the surface 210A of the two alignment features 210. In one embodiment, the substrate supporting surface 254A is tilted at an angle "A" between about 0.02 degrees and about 85 degrees from the horizontal plane "H". It has been found that due to the near frictionless system created by the fluid cushion the angle can be as small as <1 degree and still provide adequate force to reliably align the substrate to the alignment features 210. In general, it is desirable to assure that substrate supporting surface 254A and the optics 220 are in line so that the focal point of the line of radiation 222 will not vary across the substrate.

In one embodiment, during steps 310 and 312, the substrate is maintained on the cushion of fluid for a desired period of time, or until a desired average temperature is achieved within the substrate to preheat the substrate, as discussed above in relation to FIG. 1. In one embodiment, the sum of the time used to complete steps 310 and 312 is between 5 seconds and about 30 seconds. In one embodiment, it is desirable to position the substrate on a cushion of fluid that is formed over the substrate supporting surface for a desired period of time to allow the substrate temperature to uniformly heat up to a desired temperature before it is placed in contact with the heated substrate support or other supporting components. In another embodiment, it is desirable to allow the substrate to contact the alignment features 210 while it is positioned on the cushion of fluid to allow the thermal environment for each processed substrates to be repeatable. In one embodiment, the alignment features 210 are formed to minimize the contact between the substrate and the surface 210A and/or are made of a material that has a high thermal resistance (e.g., ceramic material) so that the contact between the alignment pins and the substrate will not be a source for temperature non-uniformity.

In the next step, step 314, the substrate is disposed on the substrate supporting surface 254A by reducing or halting the flow of fluid through the ports 111. In one embodiment, the fluid flow through the ports is halted so that the substrate can contact the substrate supporting surface 254A and the rest of the process can be performed on the substrate. In one embodiment, to improve thermal contact between the substrate and the substrate support the substrate is then clamped, or "chucked", to the substrate surface 254A by use of a convention electrostatic chuck means, a vacuum chuck means, or a physical clamping mechanism. In some configurations, it may further be desirable to deliver a low flow of fluid to the backside of the "chucked" substrate and the substrate supporting surface 254A to improve the thermal coupling during the processing step(s) (i.e., step 316). Referring to FIG. 2A, in one embodiment, the fluid line 254C that is connected to the fluid delivery system 130 and the ports 111 is also controllably connected to a conventional vacuum generating device 254D (e.g., mechanical pump) to allow the substrate to be vacuum chucked to the substrate surface 254A through the ports 111 during one or more parts of step 314 and/or step 316.

In the next step, step 316, one or more processing steps are performed on the substrate. In general, the processing chamber 250 may be adapted to perform one or more RTP, CVD, PVD, ALD, dry etching, laser annealing, or other similar type of substrate processing steps on the substrate disposed on the support 254.

In the next step, step 318, the substrate is then removed from the substrate support 252, transferred to a robot using the lift assembly 240, and then removed from the processing region 260 through the access port 251B using the robot.

While the foregoing is directed to the preferred embodiment of the present invention, other and further embodiments of the invention may be devised without departing from the basic scope thereof. The scope of the invention is determined by the claims that follow.

What is claimed is:

1. A method of processing a substrate, comprising:
    heating a substrate support having a first surface;
    delivering a flow of fluid to a plurality of ports formed in the substrate support, wherein the flow of fluid creates a cushion of fluid that is adapted to support the weight of the substrate;
    positioning the substrate on the cushion of fluid for a period of time sufficient to allow the substrate to reach a desired average temperature;
    reducing the flow of fluid to allow the substrate to contact at least a portion of the first surface after the substrate has reached the desired average temperature; and
    performing a process on the substrate disposed on the first surface.

2. The method of claim 1, wherein the period of time is about 5 seconds to about 30 seconds.

3. The method of claim 1, wherein the process performed on the substrate is annealing, chemical vapor deposition, physical vapor deposition, atomic layer deposition, or dry etching.

4. The method of claim 1, wherein the substrate is at a first substrate temperature when positioned on the cushion of fluid, and wherein the desired average temperature is greater than the first substrate temperature.

5. The method of claim 1, wherein the performing a process on the substrate comprises performing an annealing process.

6. The method of claim 1, wherein the cushion of fluid comprises nitrogen, helium, argon, xenon, or krypton.

7. The method of claim 1, wherein the cushion of fluid creates a gap between the substrate and the substrate support, and wherein the gap is between about 1 micrometer and 1000 micrometers.

8. A method of processing a substrate, comprising:
    heating a substrate support having a first surface;
    delivering a flow of fluid to a plurality of ports formed in the substrate support, wherein the flow of fluid creates a cushion of fluid that is adapted to support the weight of the substrate;
    positioning the substrate at a first substrate temperature on the cushion of fluid for a period of time sufficient to allow the substrate to reach a desired temperature greater than the first substrate temperature;
    reducing the flow of fluid to allow the substrate to contact at least a portion of the first surface; and
    performing a laser annealing process on the substrate disposed on the first surface.

9. The method of claim 8, wherein the desired temperature is a substantially uniform temperature across the substrate.

10. The method of claim 8, wherein the ports are oriented in a direction normal to the surface of the substrate when delivering the flow of fluid.

11. The method of claim 8, wherein the delivering a flow of fluid comprises delivering the flow of fluid through the plurality of ports at a subsonic velocity.

12. The method of claim 8, wherein the flow of fluid is delivered at a flow rate of about 200 sccm to about 600 sccm.

13. The method of claim 8, wherein the substrate is not in physical contact with the first surface when the substrate is positioned on the cushion of fluid.

14. The method of claim 8, wherein the desired temperature has less than a 2 degree variation across the substrate.

15. A method of processing a substrate, comprising:
    heating a substrate support having a first surface;
    delivering a flow of fluid to a plurality of ports formed in the substrate support, wherein the flow of fluid creates a cushion of fluid that is adapted to support the weight of the substrate, and wherein the cushion of fluid creates a gap within a range of about 1 micrometer and 1000 micrometers between the substrate and the substrate support;
    positioning the substrate at a first substrate temperature on the cushion of fluid;
    maintaining the substrate on the cushion of fluid for a period of time sufficient to allow the substrate to reach a desired second substrate temperature greater than the first substrate temperature;
    reducing the flow of fluid to allow the substrate to contact at least a portion of the first surface; and
    performing an annealing process on the substrate disposed on the first surface.

16. The method of claim 15, wherein the substrate support is heated to a temperature between about 450 degrees Celsius and about 800 degrees Celsius.

17. The method of claim 16, wherein the annealing process is a laser annealing process.

18. The method of claim 17, wherein an optical sensor measures the size of the gap.

19. The method of claim 18, wherein a system controller adjusts the flow of fluid in response to measurements made by the optical sensor.

* * * * *